US005789040A

United States Patent [19]
Martinu et al.

[11] Patent Number: 5,789,040
[45] Date of Patent: Aug. 4, 1998

[54] METHODS AND APPARATUS FOR SIMULTANEOUS MULTI-SIDED COATING OF OPTICAL THIN FILM DESIGNS USING DUAL-FREQUENCY PLASMA-ENHANCED CHEMICAL VAPOR DEPOSITION

[75] Inventors: Ludvik Martinu, Montreal; Jolanta E. Klemberg-Sapieha, Pointe Claire, both of Canada; Nancy Lee Schultz Yamasaki; Christopher Wayne Lantman, both of Santa Rosa, Calif.

[73] Assignee: Optical Coating Laboratory, Inc., Santa Rosa, Calif.

[21] Appl. No.: 861,246

[22] Filed: May 21, 1997

Related U.S. Application Data

[60] Provisional application No. 60/017,192 May 22, 1992.

[51] Int. Cl.$^6$ .................................................... C23C 16/50
[52] U.S. Cl. ........................ 427/575; 427/255.5; 427/569
[58] Field of Search ........................... 427/569, 575, 427/255.5; 118/723 E

[56] References Cited

U.S. PATENT DOCUMENTS

| | | | |
|---|---|---|---|
| 3,123,490 | 3/1964 | Bolomey et al. | 106/291 |
| 3,814,983 | 6/1974 | Weissfloch et al. | 315/39 |
| 3,858,977 | 1/1975 | Baird et al. | 356/71 |
| 4,168,986 | 9/1979 | Venis, Jr. | 106/291 |
| 4,434,010 | 2/1984 | Ash | 106/291 |
| 4,461,239 | 7/1984 | Cannella et al. | 118/723 E |
| 4,664,951 | 5/1987 | Doehler | 427/255.5 |
| 4,971,667 | 11/1990 | Yamazaki et al. | 204/192.32 |
| 5,017,404 | 5/1991 | Paquet et al. | 427/45.1 |
| 5,041,303 | 8/1991 | Wertheimer et al. | 427/39 |
| 5,062,508 | 11/1991 | Ackermann et al. | 118/723 |
| 5,134,965 | 8/1992 | Tokuda et al. | 118/723 |
| 5,135,812 | 8/1992 | Phillips et al. | 428/403 |
| 5,211,759 | 5/1993 | Zimmermann et al. | 118/723 |
| 5,227,202 | 7/1993 | Thiebaud et al. | 427/488 |

(List continued on next page.)

FOREIGN PATENT DOCUMENTS

| | | |
|---|---|---|
| 0 154 482 A2 | 9/1985 | European Pat. Off. . |
| 0 455 551 A1 | 6/1991 | European Pat. Off. . |
| 0 370 701 B1 | 8/1994 | European Pat. Off. . |

OTHER PUBLICATIONS

Rostaing et al., Thin Solid Films, 236, pp. 58–63 (no month), 1993.

Martinu, L.; Klemberg–Sapieha, J.E.; and, Wertheimer, M.R., "Dual–Mode Microwave/Radio Frequency Plasma Deposition of Dielectric Thin Films," Appl. Phys. Lett., vol. 54, No. 26, pp. 2645–2647, Jun. 26, 1989.

Martinu, L. and Wertheimer, M.R., "Ion Assisted Thin Film Growth in Dual Microwave/Radio Frequency Plasmas," Materials Science Forum, vol. 140–142, pp. 405–420, 1993 (no month).

(List continued on next page.)

*Primary Examiner*—Shrive Beck
*Assistant Examiner*—Timothy Meeks
*Attorney, Agent, or Firm*—Workman, Nydegger & Seeley

[57] ABSTRACT

The present invention is directed to methods and apparatus for depositing optical thin film coatings simultaneously onto both sides of at least one substrate in a dual-frequency plasma-enhanced chemical vapor deposition vacuum reaction chamber utilizing microwave and radio frequency energies. The substrate can be a continuous substrate, such as a flexible polymer web, or it can be one or more discrete substrates, such as rigid plastic, glass, or glass/polymer composite substrates. The substrate can be processed in a stationary or an in-line processing mode. In addition, the coatings deposited simultaneously onto both sides of the substrate can be identical, i.e. symmetrical, or different, i.e., non-symmetrical. The plasma attributes and reaction conditions on either side of the substrate can be independently controlled to provide either identical or different coating compositions and properties on the two sides of the substrate. Multiple plasmas can also be generated, in either an overlapping or isolated manner, to form multiple independently-controlled CVD reaction zones for simultaneous deposition of either identical or different coatings onto the sides of the substrate within the different zones.

17 Claims, 3 Drawing Sheets

U.S. PATENT DOCUMENTS

| | | | |
|---|---|---|---|
| 5,242,740 | 9/1993 | Rostaing et al. | 428/212 |
| 5,246,768 | 9/1993 | Rostaing et al. | 428/213 |
| 5,250,328 | 10/1993 | Otto | 427/535 |
| 5,310,452 | 5/1994 | Doki et al. | 156/643 |
| 5,326,404 | 7/1994 | Sato | 118/723 |
| 5,350,605 | 9/1994 | Rostaing et al. | 427/536 |
| 5,453,305 | 9/1995 | Lee | 427/575 |
| 5,514,217 | 5/1996 | Niino et al. | 118/723 |
| 5,626,679 | 5/1997 | Shimizu et al. | 118/723 |

OTHER PUBLICATIONS

Rostaing, J.C. and Coeuret, F., "*Silicon–Based, Protective Transparent Multilayer Coatings Deposited at High Rate on Optical Polymers by Dual–Mode MW/r.f. PECVD,*" Thin Solid Films, 236, pp. 58–63, 1993 (no month).

Poitras, D.; Leroux, P.; Klemberg-Sapieha, J.E.; Gujrathi, S.C.; and, Martinu, L., "*Characterization of Silicon–Compound Multilayer and Graded–Index Optical Coatings Deposited by Dual–Frequency Plasma,*" Presented at the 37th Annual Meeting of the Society of Vacuum Coaters, Boston, May, 1994.

Poitras, Daniel; Klemberg-Sapieha, Jolanta E.; Moussi, Abderahman; and, Martinu, Ludvik, "*Properties of Multilayer and Graded Index Si–Based Coatings Deposited in Dual–Frequency Plasma,*" SPIE, vol. 2046, pp. 179–188, 1993 (no month).

Klemberg-Sapieha, J.E. and Martinu, L., "*Transparent Gas Barrier Coatings Produced by Dual–Frequency PECVD,*" Society of Vacuum Cleaners, 36th Annual Technical Conference Proceedings, 1993 (no month).

Liston, E.M.; Martinu, L.; and, Wertheimer, M.R., "*Plasma Surface Modification of Polymers for Improved Adhesion: A Critical Review,*" J. Adhesion Sci. Technol., vol. 7, No. 10, pp. 1091–1127, 1993 (no month).

Moisan, M. and Wertheimer, M.R., "*Comparison of Microwave and r.f. Plasmas: Fundamentals and Applications,*" Surface and Coatings Technology, 59, pp. 1–13, 1993 (no month).

Wertheimer, M.R.; Klemberg-Sapieha, J.E.; and, Corriveau, R., "*Optical Properties of Plasma–Polymerized Organosilicone Films,*" Canadian Journal of Physics, 60, pp. 628–631, 1982 (no month).

METHODS AND APPARATUS FOR SIMULTANEOUS MULTI-SIDED COATING OF OPTICAL THIN FILM DESIGNS USING DUAL-FREQUENCY PLASMA-ENHANCED CHEMICAL VAPOR DEPOSITION

BACKGROUND OF THE INVENTION

1. The Field of the Invention

The present invention is directed to methods and apparatus for depositing optical thin film coatings simultaneously onto both sides of one or more substrates in a dual-frequency plasma-enhanced chemical vapor deposition vacuum chamber utilizing microwave and radio frequency energies.

2. Related Application

Benefit of the earlier filing date of Provisional patent application Ser. No. 60/017,192, filed May 22, 1996, is claimed for this application under Section 119(e) of Title 35 of the United States Code.

3. The Relevant Technology

Chemical vapor deposition ("CVD") is a well-known coating process. In the CVD process, source materials are introduced into the reactor chamber in the gas phase. They may originate as compressed gas or as vapor from a volatile liquid or solid. The gases must be stable enough to be transported into the reactor and onto the surface without adverse reaction. Activation energy is needed to initiate the chemical reactions leading to the deposition of solid material which occurs when the source-reacting gases form a solid product on the substrate surface.

CVD is a particularly attractive process for depositing refractory materials at relatively low temperatures, or for depositing a wide variety of materials onto a unique substrate type or complicated shape. The film composition is controlled by the gas composition, and high deposition rates are attainable, typically in the 100's of Angstroms per second. In addition, multiple coating materials may be deposited by straightforward changes in the reactive gas composition greatly simplifying the coating process for multiple-layered coatings. The CVD process can result in great economy of scale for high throughput applications. This is especially true in the thermal and plasma activated CVD processes where the scaling in load size for the process is volumetric in nature. A typical application of CVD is the production of infrared-transparent hard carbon films to improve the environmental and abrasion resistance of infrared windows.

Plasma-enhanced CVD ("PECVD") is a method wherein the activation energy which initiates coating deposition is provided by generating a plasma with accompanying ionization, decomposition, and chemical reaction of the gas flow constituents. For example, the plasma may be generated at the substrate surface by applying electrical energy in the form of a direct current ("dc"), alternating current ("ac"), or radio frequency ("rf") voltage to the substrate. Alternatively the plasma may be generated at a plasma electrode, such as an electrically powered electrode, positioned with respect to the substrate surface such that the plasma is generated in the space between the electrode and the substrate surface. The plasma may also be generated by microwave ("mw") energy applied, for example, through use of a slow wave structure or directed into the reaction chamber through a microwave-transparent window. See, e.g., U.S. Pat. No. 3,814,983, issued to Weissfloch et al. and U.S. Pat. No. 5,062,508, issued to Ackermann, et al., the entire disclosures of which are hereby incorporated herein by reference. It is also known to coat multiple stationary planar glass substrates, heated to high temperatures, in a microwave PECVD process wherein multiple plasma electrodes are configured to provide overlapping, independently controlled, plasma columns. See, U.S. Pat. No. 5,017,404, issued to Paquet et al.

While PECVD is a very useful coating process, variations in the plasma density may occur which affect the uniformity of the coating being deposited, especially when relatively large substrates are desired to be coated. One approach to improving coating uniformity in a PECVD process uses a combination of independently controlled mw energy and rf energies applied simultaneously to generate a coupled plasma. One type of "dual-frequency" PECVD process utilizes mw energy directed into the reactive gas composition within the reaction chamber and rf energy applied directly to the substrate within the reaction chamber. In addition to generating plasma at the substrate surface, the rf energy induces a negative dc self-bias voltage of the substrate resulting in a useful ion bombardment effect. See, e.g., Martinu, L., et al., "Dual-mode microwave/radio frequency plasma deposition of dielectric thin films," Applied Physics Letters; 54 (1989):2645–47, and Martinu, L. and Wertheimer, M. R., "Ion Assisted Thin Film Growth In Dual Microwave/Radio Frequency Plasmas," Materials Science Forum; vol. 140–142 (1993):405–420, the entire disclosures of which are hereby incorporated herein by reference.

The independent control of plasma energy afforded by dual-frequency PECVD allows more sensitive refinement of reaction conditions and results in improved film uniformity. One difficulty, particularly with large or irregular substrates, is that the rf-powered substrate holder needs to be adapted to accommodate the desired substrate. In addition, because the rf energy is applied directly to the substrate and, thus, produces an ion bombardment effect at the substrate surface, this method cannot be used to deposit optical thin film designs onto materials susceptible to damage by electron or ion bombardment or to deposit overcoatings or patterns onto layers of materials or onto structures where such energetic bombardment would damage the previously deposited layers of material or the structures. Another problem is that, as with other PECVD processes, the dual-frequency PECVD process described permits only one side of a substrate to be coated at a time. For two-sided coatings, the substrate must be mechanically turned and the process repeated to deposit coating on the second side. This type of repetitive processing, however, greatly increases the handling and processing time and, thus, the production costs for producing two-sided coatings.

In view of the above, it would be an advancement in the art to provide methods and apparatus permitting simultaneous deposition of optical coatings onto both sides of one or more substrates and/or onto multiple surfaces of three-dimensional substrates. An important advantage of PECVD is that it can, if necessary, be utilized at very low temperatures. Because the activation energy is supplied by the plasma, rather than thermal energy, coatings can be deposited onto temperature-sensitive substrates. Accordingly, it would be an advancement in the art to provide methods and apparatus permitting simultaneous deposition of optical coatings onto multiple surfaces of even temperature-sensitive substrates.

SUMMARY AND OBJECTS OF THE INVENTION

It is an object of the present invention to provide methods and apparatus permitting simultaneous deposition of optical thin film designs onto multiple surfaces of one or more substrates. In particular, it is an object to provide methods and apparatus permitting simultaneous deposition of coatings onto multiple surfaces of one or more electrically floating substrates including stationary continuous or stationary discrete substrates as well as in-line continuous or in-line discrete substrates.

It is another object of the present invention to provide methods and apparatus permitting simultaneous deposition of optical thin film designs onto multiple surfaces of one or more substrates with a plasma-enhanced chemical vapor deposition ("PECVD") process.

It is yet another object of the present invention to provide methods and apparatus permitting simultaneous deposition of optical thin film designs onto multiple surfaces of one or more substrates with a PECVD process which utilizes dual-frequency plasma generating energies, i.e., both microwave and radio frequency energies, to permit independent control of the plasma energies.

Yet another object of the present invention is to provide methods and apparatus permitting use of dual-frequency microwave/radio frequency ("mw/rf") PECVD to simultaneously deposit either symmetrical or non-symmetrical coatings onto multiple surfaces of one or more floating substrates.

These and other objects and advantages of the invention will be better understood by reference to the detailed description, or will be appreciated by the practice of the invention. To achieve the foregoing objects, and in accordance with the invention as embodied and broadly described herein, the present invention is directed to methods and apparatus for depositing optical thin film coatings simultaneously onto multiple surfaces of at least one substrate in a dual-frequency plasma-enhanced chemical vapor deposition vacuum chamber utilizing both microwave and radio frequency energies. The substrate can be a continuous substrate, such as a flexible polymer web, or it can be one or more discrete substrates, such as rigid plastic, glass, or glass/polymer composite substrates. Multiple rows of continuous substrate or multiple rows of one or more discrete substrates can also be simultaneously processed in accord with the present invention. It will be appreciated that, for many substrates, two sides, i.e., a front side and a back side, are coated. Other types of "three-dimensional" substrates, e.g., prisms or cylindrically shaped substrates, however, have multiple surfaces to be coated. The methods and apparatus of the present invention permit deposition of coatings onto all sides to proceed simultaneously.

In accord with one embodiment of the present invention, the microwave energy is directed into the CVD reaction chamber through a microwave-transparent window. The rf energy is applied to at least one plasma electrode positioned within the reaction chamber. The substrate is processed within the combined generated plasmas in a "floating" configuration, i.e., the substrate is spaced apart from the plasma electrodes. In this configuration, the generated plasmas provide the activation energy to drive simultaneous CVD reactions on all sides of the substrate.

The methods and apparatus of the present invention permit simultaneous deposition of coatings onto all sides of the floating substrate in either a stationary mode or in a moving, i.e., "in-line," processing mode. The plasma attributes and reaction conditions surrounding the substrate can be independently controlled to provide either identical or different coating compositions and properties on different sides. In addition, or alternatively, multiple plasmas can be generated, in either an overlapping or isolated manner, to form multiple independently-controlled CVD reaction zones for simultaneous deposition of either identical or different coatings onto the sides of the substrate(s) within the different zones.

BRIEF DESCRIPTION OF THE DRAWINGS

In order that the manner in which the above-recited and other advantages and objects of the invention are obtained, a more particular description of the invention briefly described above will be rendered by reference to specific embodiments thereof illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

Figure 1A:
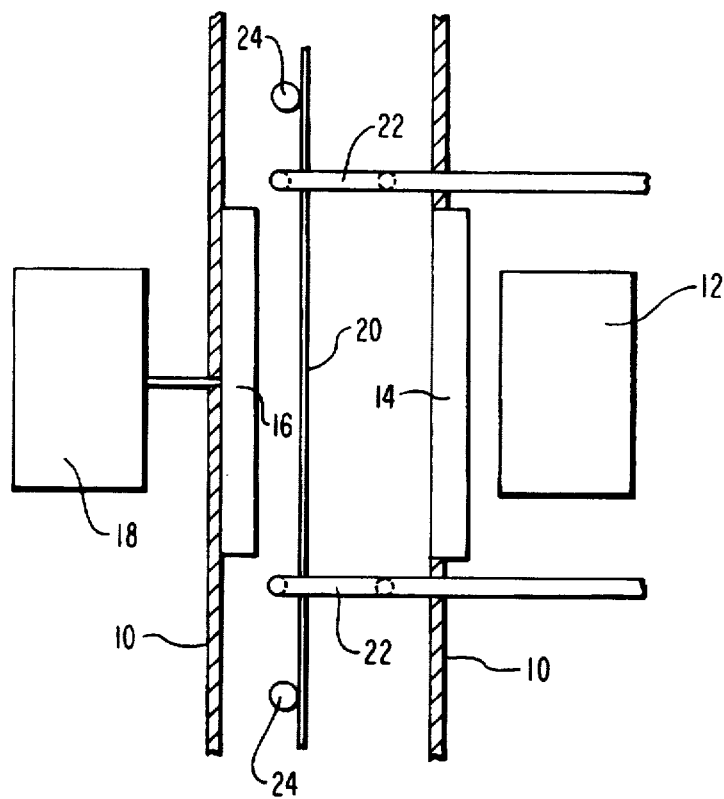
FIG. 1A illustrates schematically a top view cross-section of a portion of a dual-frequency plasma-enhanced chemical vapor deposition vacuum chamber which utilizes a combination of microwave and radio frequency energies to simultaneously deposit coatings onto both sides of a floating substrate.

The present invention is directed to methods and apparatus for depositing optical thin film coatings simultaneously onto both sides of at least one substrate in a dual-frequency plasma-enhanced chemical vapor deposition ("PECVD") vacuum chamber. For purposes of this disclosure, the term "substrate" as used herein refers to either one or more continuous substrate(s), such as a flexible polymer web(s), mounted between suitable roller or other type of supports, or to one or more discrete substrates, such as rigid plastic, glass, or glass/polymer composite substrates, mounted onto suitable supports. The substrate supports are either positioned within, or movable through, the vacuum chamber, to permit positioning and processing of the substrate in either a stationary mode or continuously moving, i.e., "in-line," processing mode.

It will be appreciated that, for many substrates, two sides, i.e., a front side and a back side, are coated. Other types of "three-dimensional" substrates, e.g., prisms or cylindrically shaped substrates, however, have multiple surfaces to be coated. The methods and apparatus of the present invention permit deposition of coatings onto all sides to proceed simultaneously. Accordingly, references herein to deposition onto either "both sides" or "multiple surfaces" of the substrate(s) are intended to be interchangeable and illustrative of the versatility of the disclosed methods and apparatus.

The dual-frequency PECVD vacuum chamber in accord with the present invention is preferably equipped with at least one microwave-transparent window through which microwave energy can be directed into the chamber and at least one radio frequency-powered plasma electrode located within the chamber. The substrate is, thus, in an electrically "floating" configuration, i.e., is spaced apart from the plasma electrodes and, thus, not subject to an rf-induced biasing effect from being directly connected to the rf energy. Many types of useful coatings, including antireflection coatings and optically variable coatings, can be deposited with the methods and apparatus of the present invention. In addition, because the substrate is floating and, therefore, not biased by rf energy applied directly to the substrate such that an ion plating effect at the substrate surface is produced, optical thin film designs onto materials susceptible to damage by electron or ion bombardment and overcoatings or patterns onto layers of materials or onto structures where energetic bombardment would damage the previously deposited layers of material or the structures can be deposited with the methods and apparatus of the present invention.

The present invention permits simultaneous deposition of optical thin film coatings onto both sides or multiple surfaces of one or more floating substrate(s) processed within the plasmas generated by the dual frequency energies, i.e., by microwave energy directed into the chamber through the window and by the radio frequency energy applied to the plasma electrodes. In addition to the independent control of the power and frequency of microwave and radio frequency energies to control the attributes of the generated plasmas afforded by such a dual-frequency system, coupling of the dual-frequency energies, i.e., with optimization of gas pressure, reactive mixture, or gas flows, also allows control of the coating materials such that different materials can be sequentially deposited or the material properties may be altered during deposition to achieve desired compositions such as optically variable coatings.

The generated plasmas may constitute a single CVD reaction zone. Depending on the transparency of the floating substrate material to the microwave and radio frequency energies, the plasmas on different sides of the substrate, generated from the same energy sources, may have similar or different attributes. Adjustments of the dual frequency energies and other reaction conditions permits simultaneous deposition of coatings having either identical or different compositions and properties onto different sides of the substrate.

It is also possible to generate multiple CVD zones within the chamber by using multiple microwave applicators, multiple microwave sources, and multiple rf-powered electrodes to engender multiple independently-controlled and/or combined plasmas. The multiple plasmas can be overlapping or can be substantially isolated from each other. In all cases, the reactive gas compositions within the multiple CVD zones can be independently varied. In this manner, coatings having different or varying compositions and properties can be simultaneously deposited onto different sides of substrate(s) processed through the different zones. Sequential processing of the substrate(s) through the different zones permits either symmetrical or non-symmetrical multi-layered coatings to be simultaneously deposited onto both sides of the substrate.

The present invention provides methods and apparatus permitting simultaneous deposition of optical thin film coatings onto multiple surfaces of one or more substrate(s) processed in either an in-line or stationary mode. The present invention also permits deposition of optical thin film coatings simultaneously onto multiple surfaces of multiple substrates arranged within the reaction chamber. For example, multiple continuous flexible webs or multiple rows of discrete substrates could be aligned within the vacuum chamber such that deposition of coatings onto all sides of all the substrates could proceed simultaneously.

Apparatus for depositing thin films onto one surface of a substrate are well known in the art. For two-sided coating applications, it is typically necessary to mechanically turn the substrate and to repeat the processing steps to deposit a coating on the second side. Accordingly, PECVD has proven useful for depositing coatings onto one side of a stationary or moving, i.e., "in-line," continuous substrate, such as a flexible polymer web, and onto one surface of stationary discrete substrates, such as rigid plastic, glass, or glass/polymer composite substrates. In contrast to either stationary or moving continuous substrate and stationary discrete substrates, deposition of uniform coatings onto moving discrete substrates with PECVD has proven difficult because the moving discrete substrates cause large variations in the localized conductance resulting in non-uniform plasma across the substrate surface.

One approach to solving this problem, specifically in respect to an rf-powered plasma coating system, is described in abandoned U.S. patent application Ser. No. 08/129,242, entitled "RF Electrode Shielding and System for Continuous Coating," commonly assigned to the assignee of the present application, the entire disclosure of which is hereby incorporated herein by reference. The disclosure of the commonly owned abandoned application Ser. No. 08/129,242, teaches using a cover plate of relatively high dielectric constant material, such as glass, disposed on the electrode between the electrode and the substrates, to diminish the variations in rf impedance as the substrates move past the electrode. The cover plate reduces the spatial variations in conductance, eliminating tuning difficulty and enhancing plasma spatial uniformity along the electrode. The disclosure also teaches a multiple electrode, multiple dark space, system wherein the dark space region associated with the relatively large gap between the powered electrode and its ground shield is filled with floating electrodes at relatively smaller spacings. These floating electrodes are spaced such that the generation of plasma within the dark space is suppressed, the impedance variation across the region is stepped in associated relatively small increments, and plasma uniformity along the electrode and deposition uniformity along the substrate are both increased.

As described above, moving discrete substrates are more difficult than stationary discrete substrates to uniformly coat in a (single energy source) PECVD process because the discontinuities introduced as the separate substrates move across the plasma electrode cause changes in the density of the plasma being generated. In a dual-frequency PECVD process, there are two different energy sources generating the plasma. While coupling of the two sources provides the ability to independently control various attributes of the plasma, the fact that there are two energy sources also increases the possibility that the plasma uniformity will vary due to some interfering affect on either one or both of the energy sources. The teachings of the co-owned abandoned application Ser. No. 08/129,242 can be applied to the dual-frequency mw/rf PECVD system in accord with the present invention to enhance the quality of coatings deposited onto moving discrete substrates.

EXAMPLE 1

A sample of PET (polyethylene terephthalate) film was coated on both sides simultaneously with $SiO_x$ material deposited from hexamethyldisiloxane (HMDSO) while being moved through a custom-built dual-frequency microwave/radio frequency PECVD roll-coating system at the Ecole Polytechnique in Montreal, Canada, comprising a LMP 83-3 Plasma Reactor (Polyplasma, Inc., Montreal, Canada) with a web handling system. The system was modified with the addition of two cylindrical studs to move the web substrate away from the rf-powered plasma electrode so that the substrate did not touch the electrode but, instead, was approximately 2 cm. from the microwave-transparent window on one side and approximately 2 cm. from the rf-powered electrode on the other side. In this configuration, the substrate adopts a floating potential and is exposed to the microwave plasma on one side and to the rf plasma on the other side. Because this substrate is transparent to both the mw and rf energies, the plasma attributes on either side are affected by the combined energies.

In the system used, the gas inlets are positioned on the mw side of the chamber and no modifications of this feature were made. Thus, the feed gas was not distributed uniformly on both sides of the substrate. The following reaction conditions were employed: Power/Bias was 100 W mw power and −200 V rf bias; Pressure was 60 mT; Time was 188 seconds; Web speed was 0.08 cm/s; the gas mixture was as follows: 8 sccm HMDSO, 30 sccm $O_2$, and 10 sccm Ar. Rutherford backscattering ("RBS") analysis identified the presence of coatings on each side of the sample. Transmission electron microscope ("TEM") imaging of cross-sections prepared from the sample gave a more refined measurement of the layer thicknesses which were approximately 0.40 μm on the side facing the microwave energy source and 0.05 μm on the side facing the radio frequency-powered electrode. Given the extremely unequal gas flows to the two sides, this variation in coating thickness is not unexpected. Optimization of the gas flows and other reaction conditions would permit desired thicknesses to be achieved on both sides.

Figure 1B:
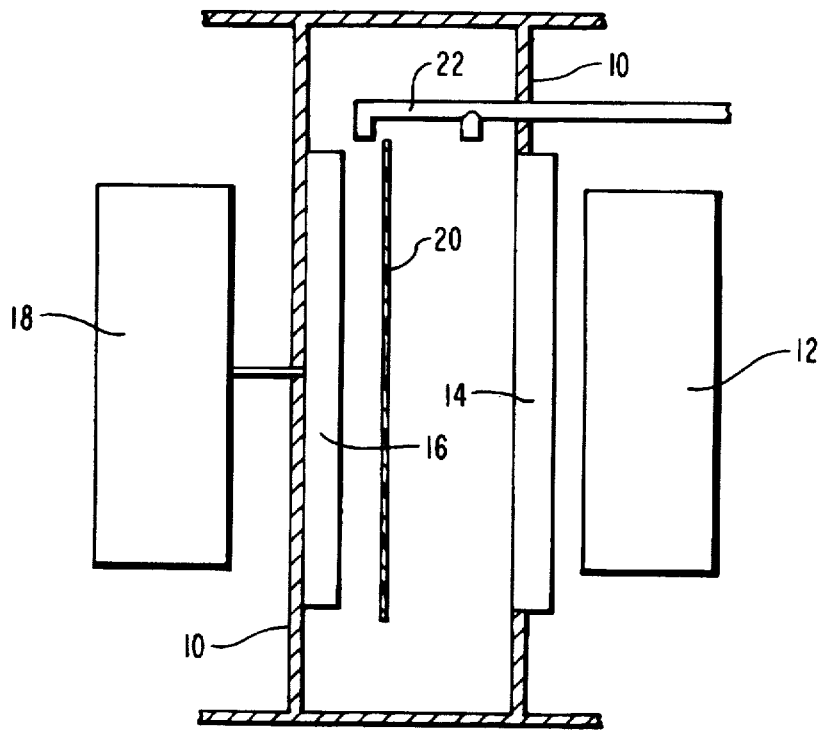
FIG. 1B illustrates schematically a side view cross-section of the portion of a dual-frequency plasma-enhanced chemical vapor deposition vacuum chamber shown in FIG. 1A.

FIGS. 1A and 1B illustrate, respectively, schematic top and side cross-section views of a portion of a dual-frequency plasma-enhanced chemical vapor deposition vacuum chamber, represented by a portion of the vacuum chamber walls 10, which utilizes a combination of microwave and radio frequency energies to simultaneously deposit coatings onto both sides of a floating substrate 20. The floating substrate is supported at either end by supports 24 (not shown in FIG. 1B). It will be appreciated that the supports could be adapted to support either a continuous flexible web substrate or one or more discrete substrates within the vacuum chamber. It will be further appreciated that the floating substrates could be processed in either a stationary mode or an in-line mode. In addition, three-dimensional substrate(s) could also be processed, if desired.

The microwave energy source 12 is positioned to direct microwave energy into the vacuum chamber through a microwave-transparent window 14. At least one radio frequency-powered plasma electrode 16 is positioned within the vacuum chamber walls 10. The rf-powered plasma electrode, as shown, is connected to an rf power supply and matching network 18 which may be positioned outside the vacuum chamber wall 10. As shown, one possible configuration for the dual-frequency energy sources is to direct the microwave energy through one vacuum chamber wall 10 and to position the rf plasma electrode along the opposite vacuum chamber wall. It will be appreciated that other configurations could also be used. Indeed, depending on the number, size, shape, and positions of the substrates and on the desired coating materials and properties, different configurations may be desirable or required. It will also be appreciated that various frequencies of microwave and rf energy can be used, in either pulsed or continuous wave mode.

The gas manifolds 22 for introducing the reactive gas composition into the vacuum chamber are shown on either side of microwave-transparent window 14 in FIG. 1A and above the microwave-transparent window 14 in FIG. 1B. It will be appreciated that additional gas manifolds could be positioned at other locations within the vacuum chamber as well. It will also be appreciated that the reactive gas compositions can be the same or different at each manifold and can also be changed sequentially, or pulsed, to effect deposition of different coatings onto the substrate surfaces.

Figure 2:
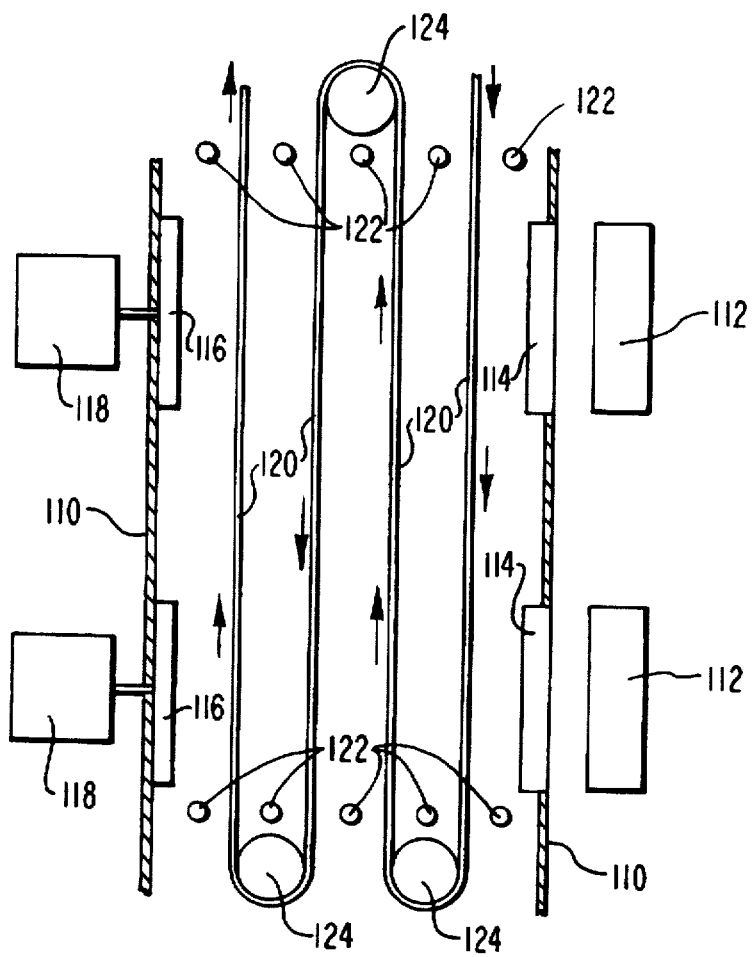
FIG. 2 illustrates schematically a top view cross-section of a portion of a dual-frequency plasma-enhanced chemical vapor deposition vacuum chamber for simultaneously depositing coatings onto both sides of a continuous flexible web substrate being moved through two, locally isolated, deposition reaction zones within the chamber to thereby deposit a desired multi-layer thin film design onto each side of the moving web.

FIG. 2 illustrates schematically a top cross-section view of a portion of a dual-frequency plasma-enhanced chemical vapor deposition vacuum chamber, represented by a portion of the vacuum chamber walls 110, for simultaneously depositing coatings onto both sides of a continuous flexible web substrate 120 being moved through two locally isolated deposition reaction zones within the chamber to thereby deposit a desired multi-layer thin film design onto each side of the moving web. The floating substrate 120 is supported by rolling supports 124 which permit the substrate to traverse the vacuum chamber back and forth. Although a single continuous web is shown, it will be appreciated that multiple separate continuous webs could simultaneously be coated on both sides as well. It will also be appreciated that the supports could be adapted to support one or more discrete substrates as well. It will be further appreciated that the floating substrates could be processed in either a stationary mode or an in-line mode.

Two independently-controllable microwave energy sources 112 are each positioned to direct microwave energy into the vacuum chamber through respective microwave-transparent windows 114. Two radio frequency-powered plasma electrodes 116 are positioned within the vacuum chamber. The rf-powered plasma electrodes, as shown, are each connected to independently-controllable rf power supplies and matching networks 118. As shown, one possible configuration for the dual-frequency energy sources is to direct the microwave energy through one wall of the chamber and to position the rf plasma electrodes along the opposite wall. The microwave and rf energies generated between the facing energy sources will generate a combined plasma zone. Thus, two separate mw/rf combined plasma zones will be formed in the configuration illustrated. These may be permitted to overlap or may be substantially isolated from one another as, for example, with differential pumping means between the zones. It will be appreciated that other configurations of the energy sources could also be used and that additional combined plasma zones could be formed within the chamber.

Multiple gas manifolds 122 for introducing the reactive gas composition into vacuum chamber 110 are shown in rows between and on either side of the surfaces of the substrate and on either side of the chamber. It will be appreciated that additional gas manifolds could be positioned at other locations within the vacuum chamber as well.

It will also be appreciated that the reactive gas compositions can be the same or different at each manifold and can also be changed sequentially to effect deposition of different coatings onto the substrate surfaces.

Figure 3:
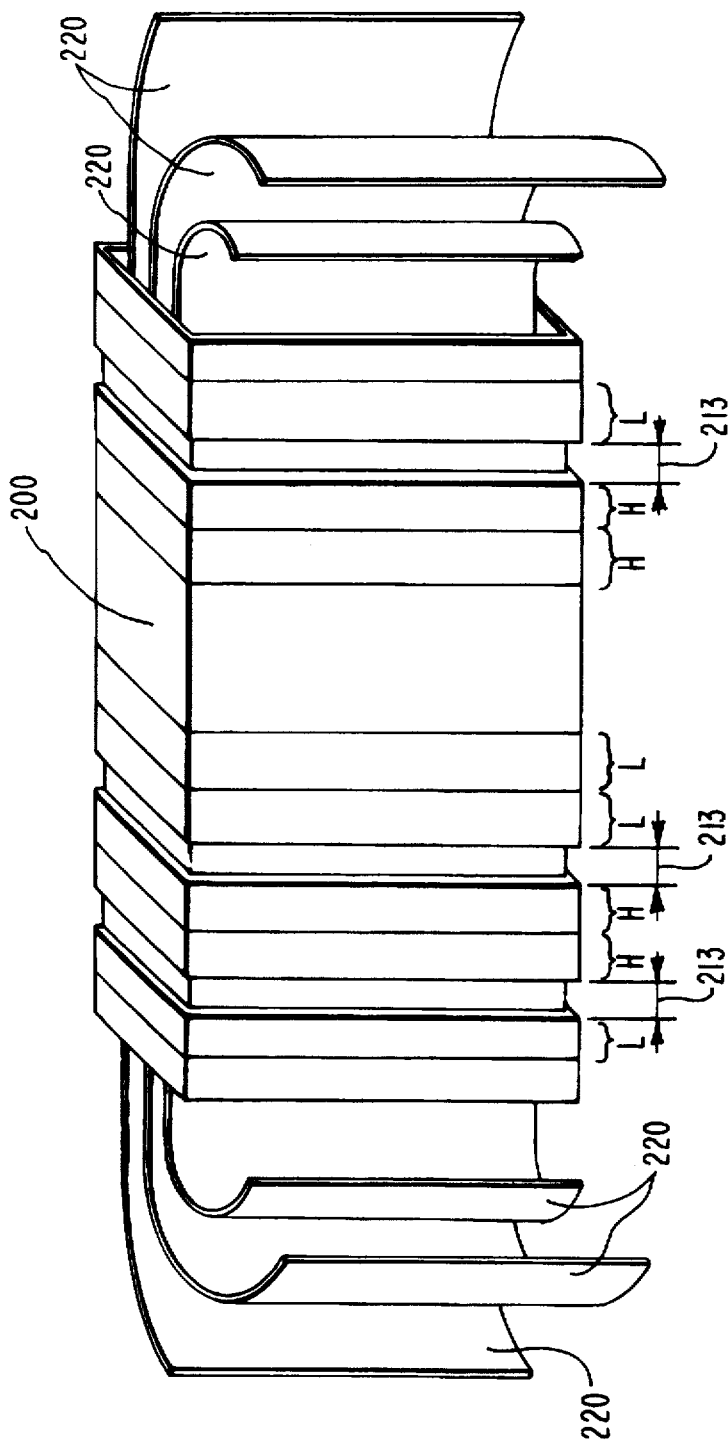
FIG. 3 illustrates a schematic perspective view of a portion of a dual-frequency plasma-enhanced chemical vapor deposition vacuum chamber for simultaneously depositing coatings onto both sides of multiple continuous flexible web substrates being moved through multiple deposition reaction zones within the chamber to thereby deposit a desired multi-layer thin film design onto both sides of each of the moving webs.

FIG. 3 illustrates a schematic perspective view of a portion of a dual-frequency plasma-enhanced chemical vapor deposition vacuum chamber 200 for simultaneously depositing coatings onto both sides of multiple continuous flexible web substrates 220 being moved through multiple, locally isolated, deposition reaction zones within the chamber to thereby deposit a desired multi-layer thin film design onto both sides of each of the moving webs. The energy sources are not shown but comprise at least one microwave energy source for directing microwave energy into the chamber through a microwave-transparent window on one wall of the chamber and at least one rf-powered plasma electrode positioned along the opposite wall of the chamber as shown in FIGS. 1 and 2.

The multiple deposition reaction zones are shown schematically with lines separating the different zones. It will be appreciated that the multiple deposition reaction zones may be independently controlled to permit different coating materials to be deposited onto the substrates within the different deposition reaction zones. For example, in FIG. 3, the letters H and L indicate that coating material having a high index of refraction is deposited within the zones marked H and coating material having a low index of refraction is deposited within the zones marked L. Differential pumping zones 213, shown schematically as recessed relative to the deposition reaction zones for illustration purposes, are utilized to substantially isolate the H and L deposition zones from each other. Multiple gas inlets (not shown) are used to provide desired reactive gas composition to each deposition reaction zone. It will be appreciated that the multiple gas inlets may also be positioned to serve as supports for the continuous flexible web substrates within the chamber. It will be appreciated that sequential processing of the substrates through the different zones permits either symmetrical or non-symmetrical multi-layered coatings to be simultaneously deposited onto both sides of the substrate.

EXAMPLE 2

A discrete glass substrate was coated on both sides simultaneously with $SiO_x$ material while traveling through a dual-frequency microwave/radio frequency PECVD system in accord with the present invention. This PECVD hardware incorporated an rf coating system as described in co-owned abandoned application Ser. No. 08/129,242 arranged opposite a custom-built microwave applicator and microwave-transparent window. The discrete substrate passed between these two energy sources at a distance of about 30 mm from the rf electrode structure and about 25 mm from the microwave window resulting in a slight floating potential. Because the substrate was transparent to both mw and rf energies, coupling can occur through the substrate to affect coating deposition on both sides. The following process conditions were used: gas mixture was 16 sccm hexamethyldisiloxane and 50 sccm oxygen delivered through a gas manifold situated just above the plane of the substrate, plus 100 sccm oxygen and 40 sccm helium from a manifold just below the microwave window; 250 W microwave power and 125 W rf power was applied; the gas pressure was controlled at 40 mTorr by variable pumping conductance as the substrate traversed the reaction zone at a speed of 10 cm/min.

The non-optimized deposition system demonstrated simultaneous two-sided coating of the substrate. Coating thickness on both sides of the substrate was analyzed by profilometry with a DekTek 3 (Sloan Technology, Santa Barbara, Calif.). Essentially identical thicknesses were deposited at the center of the substrate: 160.5 nm on the surface facing the rf electrode and 155 nm on the microwave-facing surface (1 nm standard deviation). Coating thicknesses were measured for both surfaces at five points across the substrate. The thickness ratio (ratio of thickness on each side) measured at these five points were: 0.97, 1.12, 1.31, 1.38, and 2.22. The highest ratio was observed at the location of the greatest expected nonuniformity given the non-symmetrical gas and energy distribution in the system. It will be appreciated that these, and other process conditions, can be optimized for improved uniformity.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by united states letters patent is:

1. A method for simultaneously depositing film coatings onto multiple surfaces of a substrate, said method comprising the steps of:
    (a) obtaining a dual-frequency plasma-enhanced chemical vapor deposition device, said device comprising:
        (i) a vacuum reaction chamber;
        (ii) means for introducing a selected reactive gas composition into said vacuum reaction chamber;
        (iii) means for generating a deposition plasma from said reactive gas composition, said means comprising at least one microwave energy source for directing microwave energy into said vacuum reaction chamber; and at least one radio frequency-powered plasma electrode positioned within said vacuum reaction chamber; and
        (iv) means for supporting at least one substrate within said deposition plasma such that multiple surfaces of said substrate are simultaneously exposed to a portion of said deposition plasma;
    (b) generating a dual-frequency plasma activation region within said vacuum reaction chamber by (i) directing a selected microwave energy into said vacuum reaction chamber to form a first plasma activation region and (ii) generating a radio frequency energy and coupling said radio frequency energy to said plasma electrode within said vacuum reaction chamber to form a second plasma activation region having at least a portion that overlaps a portion of said first plasma activation region;
    (c) generating a deposition plasma by introducing a selected reactive gas composition into said dual-frequency plasma activation region within said vacuum reaction chamber; and
    (d) transporting a substrate through said deposition plasma such that said substrate is displaced away from said plasma electrode and multiple surfaces on all opposing sides of said substrate are simultaneously exposed to said deposition plasma.

2. A method for simultaneously depositing film coatings onto multiple surfaces of a substrate, said method comprising the steps of:
    (a) directing microwave energy into a vacuum reaction chamber to form a first plasma activation region within said vacuum reaction chamber;

(b) coupling radio frequency energy to a plasma electrode positioned within said vacuum reaction chamber to form a second plasma activation region within said vacuum reaction chamber, said second plasma activation region having at least a portion that overlaps a portion of said first plasma activation region to thereby define a dual-frequency plasma region within said vacuum reaction chamber;

(c) supplying a reactive gas composition to said dual-frequency plasma activation region such that a deposition plasma for depositing a selected film coating onto a substrate is formed within said dual-frequency plasma activation region; and (d) supporting a substrate within said deposition plasma such that said substrate is displaced away from said plasma electrode and multiple surfaces on all opposing sides of said substrate are simultaneously exposed to said deposition plasma.

3. The method of claim 2, wherein the power and frequency of the microwave energy source and the rf energy source are adjusted to obtain a deposition plasma that deposits a symmetrical coating onto said multiple surfaces of said substrate.

4. The method of claim 2, wherein a first reactive gas composition is supplied to said first plasma activation region and a second reactive gas composition is supplied to said second plasma activation region to obtain a deposition plasma that deposits a symmetrical coating onto said multiple surfaces of said substrate.

5. The method of claim 2, wherein the pressure of the reactive gas composition is selected to obtain a deposition plasma that deposits a symmetrical coating onto said multiple surfaces of said substrate.

6. The method of claim 2, wherein a gas flow is selected to obtain a deposition plasma that deposits a symmetrical coating onto said multiple surfaces of said substrate.

7. The method of claim 2, wherein the power and frequency of the microwave energy source and the rf energy source are adjusted to obtain a deposition plasma that deposits a non-symmetrical coating onto said multiple surfaces of said substrate.

8. The method of claim 2, wherein a first reactive gas composition is supplied to said first plasma activation region and a second reactive gas composition is supplied to said second plasma activation region to obtain a deposition plasma that deposits a non-symmetrical coating onto said multiple surfaces of said substrate.

9. The method of claim 2, wherein the pressure of the reactive gas composition is selected to obtain a deposition plasma that deposits a non-symmetrical coating onto said multiple surfaces of said substrate.

10. The method of claim 2, wherein a gas flow is selected to obtain a deposition plasma that deposits a non-symmetrical coating onto said multiple surfaces of said substrate.

11. The method of claim 2, wherein said step of supporting a substrate within said deposition plasma such that said multiple surfaces of said substrate are simultaneously exposed to said deposition plasma comprises moving at least one continuous substrate through said deposition plasma.

12. The method of claim 2, wherein said step of supporting a substrate within said deposition plasma such that said multiple surfaces of said substrate are simultaneously exposed to said deposition plasma comprises moving at least one discrete substrate through said deposition plasma.

13. The method of claim 2, wherein said step of supporting a substrate within said deposition plasma such that said multiple surfaces of said substrate are simultaneously exposed to said deposition plasma comprises supporting at least one stationary continuous substrate within said deposition plasma.

14. The method of claim 2, wherein said step of supporting a substrate within said deposition plasma such that said multiple surfaces of said substrate are simultaneously exposed to said deposition plasma comprises supporting at least one stationary discrete substrate within said deposition plasma.

15. The method of claim 2, wherein multiple microwave energy sources and multiple radio frequency powered plasma electrodes are used to generate multiple dual-frequency plasma activation regions.

16. The method of claim 15, wherein at least a portion of said multiple dual-frequency plasma activation regions are physically isolated and independently controlled with respect to the other dual-frequency plasma activation regions.

17. The method of claim 15, wherein multiple different reactive gas compositions are introduced to thereby generate different deposition plasmas within said multiple plasma activation regions.

\* \* \* \* \*